United States Patent
Schroth et al.

(10) Patent No.: US 7,550,988 B2
(45) Date of Patent: Jun. 23, 2009

(54) TEST DEVICE WITH TEST PARAMETER ADAPTATION

(75) Inventors: Albrecht Schroth, Herrenberg (DE); Sabine Funke-Schaeff, Aidlingen-Dachtel (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 301 days.

(21) Appl. No.: 11/388,306

(22) Filed: Mar. 22, 2006

(65) Prior Publication Data
US 2006/0282736 A1    Dec. 14, 2006

(30) Foreign Application Priority Data
May 20, 2005    (EP)    .................. 05104303

(51) Int. Cl.
*G01R 31/28*    (2006.01)
*G06F 19/00*    (2006.01)

(52) U.S. Cl. .................. 324/765; 702/85
(58) Field of Classification Search .......... 324/765; 714/724; 702/117, 122, 85, 106, 120
See application file for complete search history.

(56) References Cited
U.S. PATENT DOCUMENTS

| | | | | |
|---|---|---|---|---|
| 4,168,796 A | * | 9/1979 | Fulks et al. .................. 714/734 |
| 4,242,751 A | * | 12/1980 | Henckels et al. ............ 714/737 |
| 4,709,366 A | * | 11/1987 | Scott et al. .................... 714/46 |
| 5,175,495 A | * | 12/1992 | Brahme et al. .............. 714/738 |
| 5,235,271 A | * | 8/1993 | Kira ........................... 324/765 |
| 5,737,512 A | | 4/1998 | Proudfoot et al. ............. 714/32 |
| 5,777,873 A | * | 7/1998 | Cox et al. ..................... 700/79 |
| 6,028,439 A | | 2/2000 | Arkin et al. ................. 324/765 |
| 6,191,600 B1 | * | 2/2001 | Swart .......................... 324/761 |
| 2003/0005375 A1 | * | 1/2003 | Krech et al. ................. 714/724 |

FOREIGN PATENT DOCUMENTS

EP    0 388 107    9/1990
WO    WO 2004/072669    8/2004

* cited by examiner

*Primary Examiner*—Ernest F Karlsen
(74) *Attorney, Agent, or Firm*—Holland & Hart, LLP

(57) ABSTRACT

A test device for testing a device under test, wherein the test device is adapted for providing a connection to a central controller, the test device comprising a first interface for receiving a test procedure activation signal from the central controller, and a processor for performing a test procedure on the basis of a test procedure data upon receipt of the test procedure activation signal, wherein the processor is capable of adjusting the test procedure upon receipt of a feedback signal from the device under test.

16 Claims, 4 Drawing Sheets

TEST DEVICE WITH TEST PARAMETER ADAPTATION

BACKGROUND ART

1. Field of the Invention

The present invention relates to a test device.

2. Discussion of the Background Art

For testing electronic devices, in particular integrated electronic circuits providing digital electrical output signals, a test or stimulus signal is fed to an input of the device under test, and a response signal of the device under test is evaluated by an automatic test equipment, for example by comparison with expected data.

SUMMARY OF THE INVENTION

It is an object of the invention to enable the test of a device under test sufficiently fast. This may be achieved by the independent claims. Exemplary embodiments are shown by the dependent claims.

According to an exemplary embodiment of the present invention, a test device for testing a device under test is provided. The test device provides a connection to a central control device. The test device comprises a first interface for receiving a test procedure activation signal from the central control device, and a processor for performing a test procedure on the basis of a test procedure data upon receipt of the test procedure activation signal, wherein the processor is capable of adjusting the test procedure upon receipt of a feedback signal from the device under test.

According to still another exemplary embodiment of the present invention, a method of testing a device under test by a test device adapted for providing a connection to a central control device is provided. The method may comprise the steps of supplying a test procedure activation signal from the central control device to the test device, and performing a test procedure for testing the device under test on the basis of test procedure data upon receipt of the test procedure activation signal, wherein the test procedure is adjustable upon receipt of a feedback signal from the device under test.

According to still another exemplary embodiment of the present invention, a computer-readable medium is provided, in which a computer program of testing a device under test by a test device adapted for providing a connection to a central control device is stored which, when being executed by a processor of the test device and/or of a processor of the central control device, is adapted to control or carry out the above-mentioned method steps According to yet another exemplary embodiment of the present invention, a program element of testing a device under test by a test device adapted for providing a connection to a central control device is provided, which, when being executed by a processor of the test device and/or of a processor of the central control device, is adapted to control or carry out the above-mentioned method steps.

Exemplary embodiments of the invention can be partly or entirely embodied or supported by one or more suitable software programs, which can be stored on or otherwise provided by any kind of data carrier, and which might be executed in or by any suitable data processing unit. The testing scheme according to the invention can be realized by a computer program, i.e. by software, or by using one or more special electronic optimization circuits, i.e. in hardware, or in hybrid form, i.e. by means of software components and hardware components.

One exemplary embodiment according to the invention can be seen in the fact that a test device for a test array is provided, wherein at least a part of the "test intelligence" for controlling or regulating a test may be sourced out from a central control station to the test device and is thus arranged locally in the test device which may be directly coupled to a device under test (DUT). In other words, the test intelligence may be distributed between the central control device (for instance a workstation with may be operated by a user) and the test device holding one or more devices under test. This may allow to create a distributed system with both centralized and decentralized test performance capabilities. However, test procedure data defining a test routine to be carried out may be stored in the test device or may be stored in the central control device.

Furthermore, the processor of the test device may be capable to adjust the test procedure based on a feedback signal received from the device under test. In other words, a feedback loop may be implemented in the signal path between the test device and the device under test, via which feedback loop a response of the DUT to the applied test procedure may be sent back to the test device. This response may allow to regulate the test procedure, that is to say to modify test parameters to compensate any artifact occurring due to the fact that a signal may be disturbed by a plurality of effects effecting a "real" signal along its propagation path.

When an electrical signal travels from the test device through the DUT and back to the test device, several disturbing effects may take place which may manipulate the signal in an undesired manner and which thus may falsify the test measurement. Such effects may have their origin in the physical connection between test device and DUT, particularly may result from the connection between test device and DUT and from the wiring which act upon the signal which is exposed to effects like ohmic damping, signal reflection and RC delay. Such "loss" effects may be detected qualitatively and/or quantitatively from the feedback signals, for instance from an analysis of signal running time, amplitude drop and/or signal deformation. Such effects may be compensated by modifying the test procedure based on the artifacts determined from evaluating the feedback from the DUT. For instance, a test voltage pulse may have a desired peak value of 5V and a length of 1 μs. A received feedback signal may be broadened in time to a length of 2 μs and may be damped to a peak value of 3V. On the basis of the knowledge of such a feedback, the parameters of the test voltage pulse may be adjusted accordingly so that the artifacts may be eliminated or reduced. For instance, the peak voltage may be selected larger than 5V and the time length may be selected shorter than 1 μs.

The adjustment according to an embodiment of the invention may include compensation of signal running time due to a length of a wiring, compensation of voltage values due to ohmic damping or signal manipulation (for instance in an analog-to-digital-converter), or adjustment of a current value (AC or DC). This adjustment may be performed decentralized in the test device in contrast to a less flexible adjustment in the central control device. This decentralization may allow for an adjustment "pin per pin", that is to say individually for different pins of the DUT.

According to one exemplary embodiment of the invention, a driver unit located in the test device and capable of generating test signals may be tuned to adjust the test signal pin-wise to a desired signal form, particularly wave form. Thus, at least one test signal parameter may be adjusted, for instance a signal threshold value.

The term "feedback signal" particularly denotes any return or response signal coming from the DUT after having applied a stimulus. Such a feedback may serve as a basis for regulating a test procedure.

The term "test intelligence" particularly denotes hardware and software resources which actively participate in controlling or regulating a test for verifying the proper function of a product. Components contributing to test intelligence of a test system are data processors providing computing power for actively carrying out the test as well as storage units providing data processors with at least a part of test procedure data (e.g. product-specific test sequences).

The combination of a processor and a (partial) test sequence stored as test procedure data in the storage unit of the test device allow the test device to contribute to the test of the DUT which test is thus not exclusively controlled by a central control device like a workstation. However, the test device according to the invention may be a non-autarkic device which may perform a test (only) in collaboration, coaction or even interaction with the central control device. According to an embodiment of the invention, the central control device may centrally provide a test procedure activation signal (e.g. for initiating or starting a test). However, test procedure data (e.g. determining an actual test routine required for performing a test) are peripherally stored in the test device, so that a part of the intelligence of the system is transferred from the central control device to the test device. It is noted that, according to an exemplary embodiment of the invention, the central control device may, in addition to the test procedure activation signal, provide a contribution to the test procedure data which may then, in combination with the test procedure data locally stored in the test device, may form the basis for the test.

According to another exemplary embodiment of the invention, the only contribution of the central control device to the test intelligence is a signal which unspecifically causes the test device to initiate a test. In this case, the central control device merely activates the test, but does not care at all about details of a test sequence to be executed to actually perform a particular test.

Particularly, the test procedure activation signal of the central control device may provide test control information on a relatively abstract level. For instance, the test procedure activation signal may include the command "perform a test X on a DUT Y". Or, the test procedure activation signal may include the command "supply pins 32 and 58 of the test chip with a rectangular 5V test signal and measure the response on pins 12 and 18". The test procedure data of the test device may provide test control information on a more concrete level. e.g., the test procedure data may generate test signals required to perform a test X on a DUT Y, or may generate a rectangular 5V test signal for the pins 32 and 58 of the test chip and may calculate a voltage compensation of 0.1V to be added to the 5V to compensate ohmic losses on the signal path between the test device and the DUT. Further, the test procedure data may autonomously synchronize the timing between test signals and response signals and may thus ensure to correctly identify the response signals of pins 12 and 18.

The test procedure activation signal may activate or initiate a test procedure. The test procedure data, however, may include more specific information as to how to actually carry out a test.

According to an exemplary embodiment of the invention, a system on a chip (SOC) test can be carried out with a test array comprising a test device and a connected central control device. For instance, the test array according to the invention may be realized on the basis of a correspondingly modified 93000 SOC device of Agilent Technologies. With such a test array, the proper function of any device under test (DUT) may be checked. Such a DUT may be, for instance, a system on chip, an integrated circuit (IC), a central processing device (CPU), or any other product which shall be checked.

Since the central control device or workstation may be the performance bottleneck or limiting factor in a chip test system having all intelligence centralized in the central control device, by transferring intelligence from the workstation to the hardware or test device it may be possible to increase the test throughput because it may allow a timely parallel test of different portions of a device under test or of different devices under test. Thus, it may be dispensable according to the invention to serially sample different pins of a device under test one after the other under the sole control of a central control device, that is to say according to a conventional bus architecture. In contrast to this, according to exemplary embodiments of the invention, test procedures may be performed in parallel which is believed to decrease the test time. Thus, the test costs may in some instances be significantly reduced.

In other words, according to an exemplary embodiment of the invention, the central control device does not completely control the testers per pin alone, but may simply act as a master which provides simple or generic test control commands to the test device which, in turn, using pre-stored test schemes on the storage unit, carries out the tests using the processor of the test device.

According to an exemplary embodiment of the invention, a test array is provided, wherein a test device of such a test array may comprise a source unit to provide test signals to a device under test (DUT). Response data of the DUT in response to the applied test data are transmitted from the device to a sink unit of the test device. In the sink unit, the received response data may be processed (for instance compared to a target value). The result of this test can be provided, for instance in a directly displayable manner, to the central control device, for instance a personal computer or workstation.

Test sequences on the basis of the test procedure data may include any kind of test information like a test algorithm, test parameters and other frame conditions of a test to be carried out. Such test sequences may at least partially be localized in the test device. By shifting functionality from the central control device to the test device, it may be avoided that the central control device has to sample all the pins of an integrated circuit under test one after the other. The resources of the test array may be used much more efficiently by a device according to an embodiment of the invention, since a test scheme may be parallelized at least partially.

According to an embodiment of the invention, a test duration may be significantly reduced by addressing and reading out a plurality of pins of a device under test simultaneously. This is a consequence of the transfer of test intelligence from the trunk to the branches of the test tree architecture. According to an embodiment of the invention, the central control device may only have the function to define a test sequence stored in the test device or downloadable to the test device (for instance from a database, a local area network (LAN), the internet or even from the central control device), and then the test device may, by itself, realize the control function for sampling different pins.

The test device or hardware may be divided into a plurality of test units or sub-portions (e.g. source/sink groups), wherein the test units may be assigned to groups of pins or other connection elements of a device under test so that each sub-portion may test an assigned group of pins. This may advance the parallelization of the scanning of the pins, thus accelerating the test.

It is sufficient, according to an embodiment of the invention, that the central control device only stores a device specification (e.g., "test product XY") or a test specification ("test voltage response when applying 5V to a pin"), and the test device may then, when provided with such a specification as test procedure activation signal, carries out the corresponding test using locally stored test data as test procedure data assigned to such a general specification.

By the system according to the invention, the measurement time for a test may be significantly reduced to 50% to 75% and less. The architecture of the test array allows a simple configuration and allows to employ broadcasting signals to various test units to parallelize the test procedure.

One exemplary embodiment of the invention is directed to the shifting of the abstraction level in direction of the test hardware. This may allow, instead of sequentially performing the test, to parallelize the test which may save test time and may thus reduce the cost of the test.

In the following, further exemplary embodiments of the test device will be described. However, these embodiments also apply for the test array, for the method of testing a device under test, for the computer-readable medium and for the program element.

The test device may comprise a storage unit for storing the test procedure data for carrying out the test procedure. Thus, it may be sufficient that the central control device may simple trigger the test by supplying a test procedure activation signal. The test may then be performed under the control of the test device having stored the information required for performing the test, namely the test procedure data.

The processor of the test device may be adapted to compensate, based on the feedback signal, distortions of a test signal (which may also by denoted as loss effects) occurring on the signal path between the test device and the device under test. Thus, physical effects occurring particularly in the wiring between the test device and the DUT and occurring in the front end portion of the arrangement may be at least partially compensated. Examples for such signal distortions are signal damping (for instance ohmic losses), signal reflection (for instance occurring in the case of pulsed or AC signals), and signal delay (for instance caused by parasitic capacities in combination with ohmic resistances on the signal path).

In this context, a signal driver may adjust a wave form/signal shape based on the feedback signals. For instance, such a compensation may include a pre-emphasis of a test signal. The term "pre-emphasis" may particularly denote a feedback-based signal manipulation which may provide a, for instance, rectangular pulse with an additional peak signal. Due to signal distortions on the path between the test device and the DUT, the signal is then distorted in a manner that at the end of the path, an "ideal" rectangular pulse is obtained. In other words, the compensation inversely distorts the signal selectively and in such a manner that, after the signal distortion to be compensated, a desired signal shape may be obtained. For this purpose, the signal compensation may include a filter function, wherein filter parameters are adjusted in such a manner that signal distortions may be at least partially compensated.

The test device may be adapted for testing a device under test, which comprises a plurality of connections, by performing the test procedure individually for at least a part of the connections. Particularly, the DUT may be an IC which may have a number of (for instance 1024) pins as connection elements. The test procedure may be selectively adjusted for each pin individually, as well as test signal correction based on a feedback from the DUT. This may allow to refine and further improve the test sequence.

Each of the connections may be realized as a pin of the DUT, and the test procedure may be adjusted for a part of the pins or for all of the pins individually.

Beyond this, the test device may be adapted for performing the test procedure in such a manner that parameters of signals of the test procedure are adjusted based on the feedback signal. Such parameters may be signal shape, signal amplitude, signal length, or the like.

The test device may comprise a second interface adapted to couple the test device to the device under test to perform the test procedure with the device under test. Such a second interface may be realized as a receiving portion of the test device which can receive one or more DUTs. For instance, the test device may include one or more slots in which DUTs like integrated circuits may be inserted. By inserting in the slots, a mechanical and electrical contact can be realized between the test device and the DUTs, allowing a transmission of signals. Alternatively, the test may be performed implementing a wireless communication between test device and DUT.

The test device may comprise a third interface which is adapted to couple the test device to the device under test to provide the test device with response signals generated by the device under test in response to receiving the test procedure. In other words, via the second interface, test signals may be supplied to the device under test, and via the third interface a response of the device under test may be transmitted from the device under test to the test device. The second interface and the third interface may be realized as a single common interface designed for bidirectional data transmission, or may be realized as two separate interfaces for unidirectional data transmission. The data exchange via the second interface and the third interface may be wired, that is to say via a direct ohmic coupling, or may be wireless, particularly via the exchange of electromagnetic radiation.

The processor of the test device may be adapted to process the response signals to generate test result signals. In other words, already in the test device, the response signals may be processed (for example compared with expected data) in order to generate a test result which may then directly be transmitted to the central control device. Thus, the length of the signal transmission path is reduced which may result in an improved signal-to-noise ratio, since the path along which undesired signal modifications can occur (by ohmic losses, cross-talk or the like) is shortened.

Further, a fourth interface may be provided at the test device which fourth interface may be adapted to couple the test device to the central control device to provide the central control device with the test result signals. According to this embodiment, a further interface is provided to convey the test result signals generated by the processor of the test device, that is to say generated locally, to a central control device for display, further processing, storage, analysis, or the like. Thus, the test result may be supplied to a workstation in a particular format so that it can be directly used by the central control device without further processing. The first interface and the fourth interface may be realized as a single common interface designed for bidirectional data transmission, or may be realized as two separate interfaces for unidirectional data transmission. The data exchange via the first interface and the fourth interface may be wired, that is to say via a direct ohmic coupling, or may be wireless, that is to say via the exchange of electromagnetic radiation (for instance infrared signals, radio-frequency signals).

According to another exemplary embodiment of the invention, the test device may comprise a plurality of test units or sub-devices, wherein each of the test units may be adapted to test an assigned portion of the device under test independently from other test units. In other words, the test device may be divided into sub-units, wherein each sub-unit may be coupled with an assigned portion of the device under test, for instance with a particular pin or with a group of pins of an electronic product like an integrated circuit. Each of these test units may, autarkic from other test units, test a particular part of the integrated circuit and may thus be specialized to particular frame conditions related with this portion. For instance, a first test unit may test a logic circuit on an integrated circuit, whereas a second test unit may test a storage circuit of the integrated circuit as device under test. By taking this measure, different test units may specially be designed to fulfil a particular test functionality. This allows to allocate resources in a very efficient manner to the different test units.

Moreover, the plurality of test units may be connected to be capable of simultaneously testing the assigned portions of the device under test. In other words, by dividing the test device into plurality of self-sufficient test units, a timely parallel processing of the test procedure is made possible. This may allow to significantly increase the speed of testing.

Further, the test device according to the invention may comprise a plurality of processors and/or a plurality of storage units cascaded in a hierarchical manner. This means that a structured tree-like architecture of resources may be realized. For instance, a first resource stage of the test device may directly be coupled with the central control device and may be designed to relatively unspecifically pre-process data provided by the central control device. This first resource stage may then be coupled with two or more units of a second resource stage which splits up the signal path. Optionally, one or more further resource stages may be provided to further split up the signal path in a hierarchical structure. With such an architecture, common used resources may be located in a low hierarchy level, wherein a further specialization for testing different parts of the device under test may be shifted to later stages of the hierarchy.

A test device according to an embodiment of the invention may be adapted to test at least one integrated circuit (IC) as a device under test. In this case, the test device acts as an IC tester. However, it is also possible to test a plurality of integrated circuit products in a parallel manner, by providing a plurality of receiving portions in the test device at which the various devices under test can be arranged. However, the invention is not restricted to testing integrated circuit products, but may be adapted to test any kind of products, particularly electronic devices, for instance sensors, entertainment devices, machines, computer cartridges, or the like.

The test procedure data may be adapted to fulfill at least one of the functions of the group consisting of a calibration function, a compensation function, a time control function, a synchronization function, a comparison function, and a test signal pattern generation function.

For instance, the test procedure data stored in the storage unit of the test device and being accessible by the processor may support a calibration procedure which may be necessary before carrying out the test procedure.

Additionally or alternatively, a compensation function for adjusting test signal values (for instance voltages) supplied to a signal path and being modified there (for instance due to ohmic losses) may be taken into account by the test procedure data. For instance, when a voltage signal of 5.0 V shall be provided to a portion of the test under device, then it may be necessary to provide a 5.1 V signal by the test device, since ohmic losses can occur on the signal path from the test device to the device under test.

Due to similar reasons, a timing control may be necessary, so that the timing between supplying a test signal to the device under test and receiving a response signal from the device under test may be synchronized.

Further, the test procedure data may include test sequence information for comparing a response signal to an expected value (for instance a voltage), wherein the signal may be accepted when the difference is less than a threshold, and may be rejected when the difference exceeds the threshold.

Beyond this, a test signal pattern, for instance a sequence of rectangular signals, a sine signal or a triangle signal may be generated in accordance with test data stored in the test device.

In the following, exemplary embodiments of the test array will be described. However, these embodiments also apply for the test device, for the method of testing a device under test, for the computer-readable medium and for the program element.

As already mentioned, the test device of the test array may comprise a plurality of test units, wherein each of the test units may be adapted to independently test an assigned portion of the device under test. Furthermore, the central control device may be adapted to provide at least a part of the plurality of test units with a common broadcasting signal as test procedure activation signal. In the frame of this specification, the term "broadcasting signal" particularly denotes a signal which may be provided centrally by the central control unit for a plurality of test units without individualizing the signal for the various test units. Such a broadcasting signal may be, for instance a command "calibrate!" which causes each of the test units to perform a calibration for a test of an assigned portion of the DUT. Based on this unspecific broadcasting signal, each of the test units may use locally stored calibration information for generating a specific corresponding calibration signal.

The central control device of the test device may be a workstation. In the frame of this description, a "workstation" may denote any computer which can be connected to a test device. For instance, such a computer can be a conventional personal computer or can also be a sophisticated server computer. In principle, the workstation can also be a mobile phone, a personal digital assistant or any other device which allows central control of the test array, but which does not necessarily have powerful resources, since at least a part of the intelligence may be sourced out to the test device.

The central control device may comprise a graphical user interface (GUI). Such a graphical user interface may include a display device (like a cathode ray tube, a liquid-crystal display, a plasma display device or the like) for displaying information to a human operator, like test input data or test results. Further, a graphical user interface may comprise an input device allowing a user to input data (like test data) or to provide the system with control commands. Such an input device may include a keypad, a joystick, a trackball, or may even be a microphone of a voice recognition system. The GUI may allow a human user to communicate in a bidirectional manner with the system.

BRIEF DESCRIPTION OF THE DRAWINGS

Objects and many of the attendant advantages of embodiments of the present invention will be readily appreciated and become better understood by reference to the following more detailed description of embodiments in connection with the accompanied drawings. Features that are substantially or functionally equal or similar will be referred to by the same reference signs.

DETAILED DESCRIPTION OF THE PREFERRED EMBODIMENT

Figure 1:
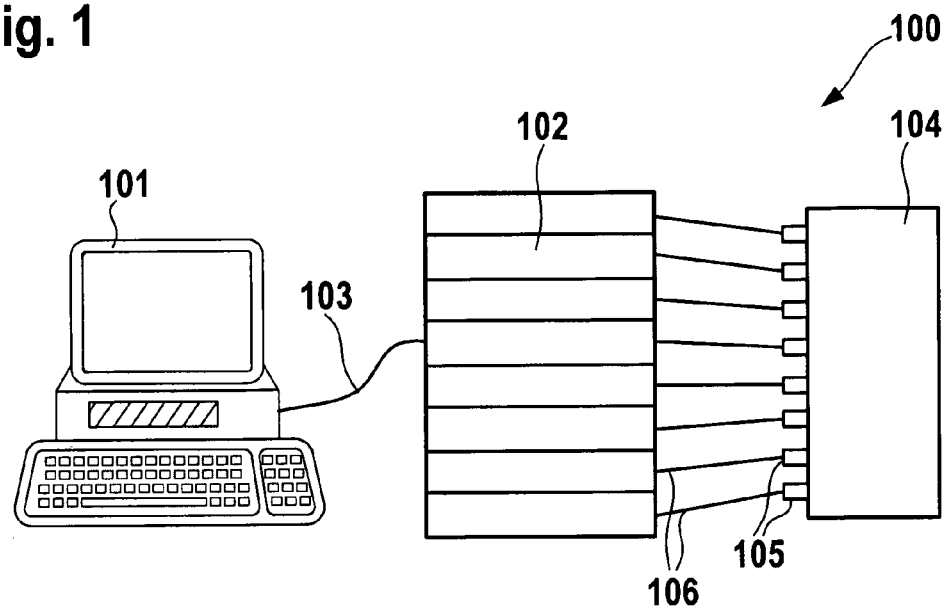
FIG. 1 shows a test array for testing a device under test.

The illustration in the drawing is schematically.

In the following, referring to FIG. 1, a test array 100 will be described.

The test array 100 comprises a workstation 101 and a test device 102. The workstation 101 is connected to the test device 102 via a connection 103. Further, an integrated circuit 104 as a device under test (DUT) is provided. The integrated circuit 104 comprises a plurality of pins 105 which are connected via connection elements 106 to the test device 102.

In the case of the test array 100, the all active test functions and corresponding test data are stored centrally on the workstation 101 and are provided to the test device 102 using a bus architecture. According to a test sequence which is provided solely by the workstation 101, the pins 105 of the integrated circuit 104 are accessed or activated sequentially, that is to say one after the other, so that the processing time for testing the integrated circuit 104 is relatively long. The test device 102 acts simply as a slave and passively carries out the test commands provided by the workstation 101 without influencing or actively controlling the test. No test data or test sequences are stored in the test device, and all the test intelligence is included in the workstation.

In the following, referring to FIG. 2, a test array 200 according to an exemplary embodiment of the invention will be described.

The test array 200 comprises a workstation 201, a test device 202 and an integrated circuit 104 as a device under test (DUT).

The test device 202 comprises a first interface 203 connected with the workstation 201 via a connection element 205 like a cable. The test device 202 is divided into a plurality of test units 204. Each of the test units is adapted to test a particular part of the integrated circuit 104 related to a pin 105 assigned to a corresponding test unit 204.

Via the first interface 203, a test procedure activation signal is provided from the workstation 201 to the test device 202. Such a test procedure activation signal is necessary to test the integrated circuit 104 concerning certain criteria.

Further, a storage unit (not shown in FIG. 2) is provided in the test device 202 and stores test procedure data. The storage unit may be a harddisk, a CD-ROM or a floppy disk inserted in a corresponding receiving unit, a USB stick or the like. Such test procedure data are necessary, in combination with the test procedure activation signal, to test the integrated circuit 104 concerning certain criteria.

Further, a microprocessor (not shown in FIG. 2) is provided in the test device 202 for generating, based on the test procedure activation signal and the test procedure data, test signals for testing the integrated circuit 104. A second interface 206 of the test device 202 couples the test device 202 to the pins 105 of the integrated circuit 104 to supply test signals to the pins 105 of the integrated circuit 104 for testing the same according to a test procedure and to receive response signals from the pins 105. The test procedure activation signal is provided centrally, the test procedure is executed locally.

Figure 2:
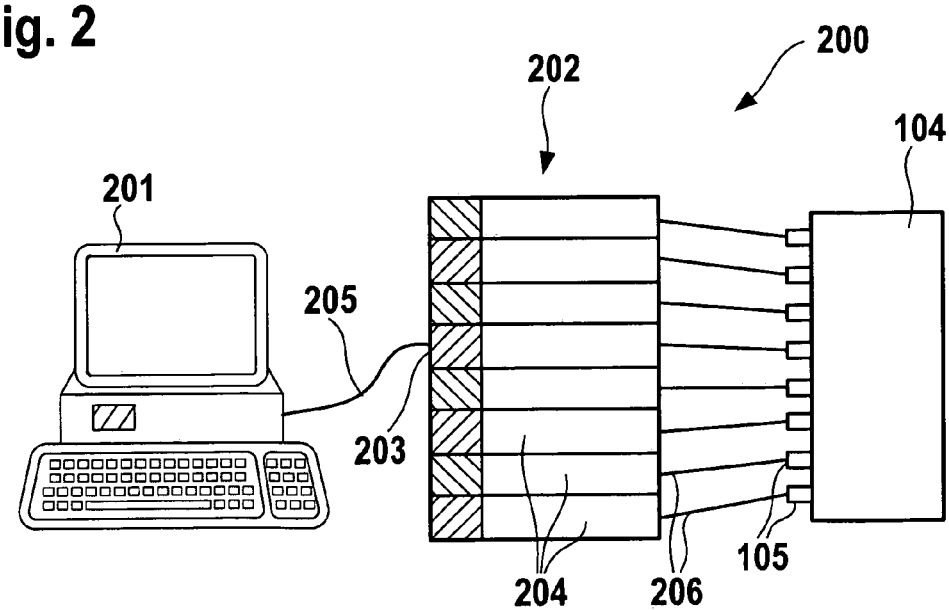
FIG. 2 shows a test array for testing a device under test according to an exemplary embodiment of the invention.

According to the architecture of the test array 200 of FIG. 2, a part of the intelligence or test resources entirely localized in the workstation 101 of FIG. 1 is shifted from the workstation 201 into the test device 202. In other words, each of the test units 204 of the test device 200 has incorporated a part of the functionality needed to perform the test of a corresponding part of the integrated circuit 104. By shifting a part of the intelligence from the central workstation 201 to the local test device 202, a parallel execution of the test of the different functional portions of the integrated circuit 104 is made possible, thus reducing the time required for testing the integrated circuit 104.

Applying electrical test signals to the portions of the integrated circuit 104 via the corresponding pins 105 results in a propagation of the test signals through the respective portions of the integrated circuit 104. When a particular portion works faultless, then predictable response signals are provided delayed at one or more corresponding pins. However, when a particular portion is defective, then response signals are provided at one or more corresponding pins which will deviate from expected values by more than a predetermined threshold value. The response signals, generated by the integrated circuit 104 automatically after having applied the test signals according to the test procedure to be carried out, are transmitted, via the second interface 206, back to the corresponding or assigned test units 204 of the test device 202.

The test device 202 is capable of adjusting the test procedure upon receipt of a feedback signal from the device under test 104. In other words, the signals which are transmitted from the device under test 104 to the test device 202 may serve as a basis for correcting test signal to be applied to the device under test 104. Such a correction or compensation may be necessary or desired due to undesired signal manipulation in the signal propagation path from the test device 202 to the device under test 104 and back. Regulating the test signals based on the feedback from the DUT 104 may improve significance and reliability of the test result. Furthermore, the decentralized architecture of the feedback, that is to say the individual feedback received from the different test units 204, may improve the quality of the test, since different physical properties of the test signal paths (for instance wiring properties) between the test units 204 and the DUT 104 may be compensated individually.

In the test device 202, the response signals may be further processed or analyzed by the processor. For this purpose, the test procedure data stored in the storage unit may be utilized as well. For instance, a comparison of the response signals with pre-stored reference values may be carried out. As an example, after applying a rectangular pulse signal with a length of 1 μs and an amplitude of 5V, a rectangular pulse signal with a length of 1 μs and an amplitude of 2V and a delay of 5 μs is expected as a response signal. Deviations of ±0.1V in the amplitude, of ±0.1 μs in length and of ±0.1 μs in delay will be considered as still acceptable. In this case, the processor of the test device 202 will classify the integrated circuit 104 as acceptable and will generate a test result signal having a logical value of "1" indicating this classification. However, in case of a larger deviation, the processor of the test device 202 will classify the integrated circuit 104 as defective and will generate a test result signal having a logical value of "0" indicating this classification.

The test result signal is then transmitted via the first interface 203 and the first connection element 205 to the workstation 201. At the workstation, a graphical user interface may be provided to display the results of the test for a human user on a display, allowing the user to determine whether the integrated circuit 104 has passed the test or not. For instance, when the test result signal has a logical value of "1", it may be displayed a message "IC acceptable". When the test result signal has a logical value of "0", it may be displayed a message "IC defective". Via the graphical user interface of the workstation 201, a user may also provide input data which may be used as frame conditions for the test. For instance, a user may input which kind of DUT shall be tested so that the processor of the test device 202 may select the correct test routine from its storage unit. Or, a user may initiate a further test in case that the result of a first test has been that the DUT is defective. In this manner, it is possible to verify the first test. Summarizing, the embodiment of FIG. 2 is a test array 200 in which the workstation 201 is basically a user interface via which general frame conditions of a test to be carried out may be defined. The actual test intelligence is included—to the described extent—in the test device 202 which actively controls or regulates the test taking into account the frame conditions defined by the workstation 201.

In the following, referring to FIG. 3, a test array 300 according to another exemplary embodiment of the invention will be described.

The test array 300 comprises a workstation 201, a test device 301 and an integrated circuit 104 as a DUT.

The test device 301 (which may also be denoted as an automatic test equipment) comprises a first test unit 302 and a second test unit 303. Each of the test units 302, 303 comprises a first interface 304 to couple the corresponding test unit 302, 303 to the workstation 201 so that a test procedure activation signal may be supplied from the workstation 201 to the sub-units 302, 303. This test procedure activation signal may be received by a central processing unit 305 of the corresponding test unit 302, 303. The central processing units 305 may access a corresponding storage device 306 on which test procedure data may be pre-stored and on which, if desired, the test procedure activation signal and optionally further test data attached to the test procedure activation signal may be buffered or stored permanently. The storage devices 306 may be a RAM, a ROM, a flash memory, an SRAM, an FRAM, an MRAM or the like.

The microprocessors 305 are adapted to generate, based on the test procedure activation signal provided by the workstation 201 and based on the test procedure data stored in the corresponding storage device 306, test signals for testing the integrated circuit 104. For supplying these test data or test signals according to a particular test procedure to the DUT 104, a second interface 307 of the corresponding test units 302, 303 is connectable to the integrated circuit 304. In more detail, the integrated circuit 304 comprises a first sub-circuit 308 and a second sub-circuit 309 which both shall be tested. The second interface 307 of the first test unit 302 is coupled with a first connection of the first sub-circuit 308 of the integrated circuit 304, and the second interface 307 of the second test unit 303 of the test device 302 is coupled with a first connection of the second sub-circuit 309 of the integrated circuit 104. The sub-circuits 308, 309 receive, via the second interfaces 307, a test sequence associated with the test signals, process these test signals according to their interior circuitry and generate a response signal.

Figure 3:
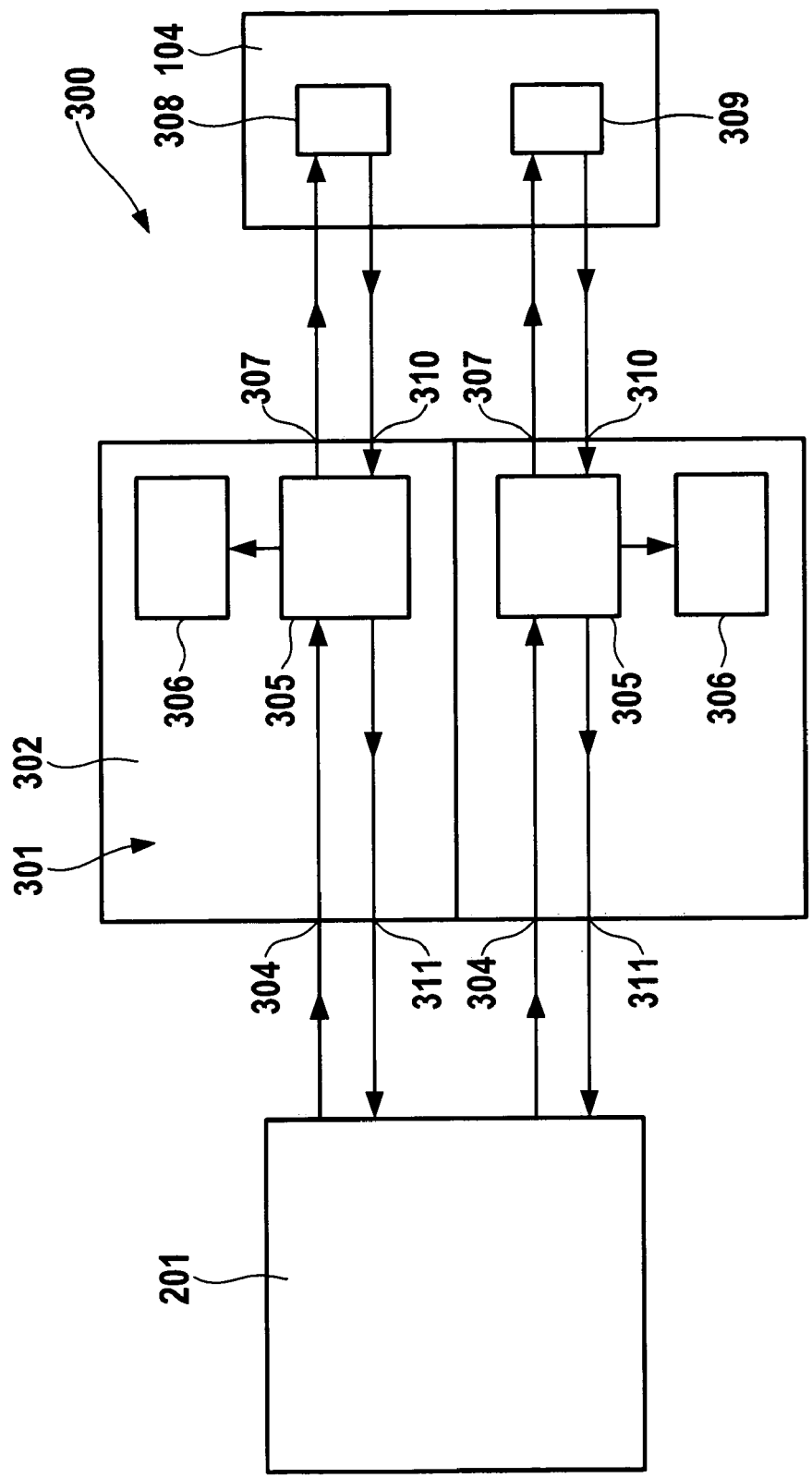
FIG. 3 shows a test array for testing a device under test according to another exemplary embodiment of the invention.

As can be seen in FIG. 3, each of the test units 302, 303 comprises a third interface 310 coupling the corresponding test units 302, 302 to a second connection of the corresponding sub-circuits 308, 309 of the integrated circuit 104. Via the third interfaces 310, the corresponding test units 302, 303 may receive the response signals of the corresponding sub-circuits 308, 309 of the integrated circuit 104.

The processor 305 is capable of adjusting the test procedure upon receipt of a feedback signal from the device under test 104. Thus, the response signals may used to regulate the generation of test signals for testing the integrated circuit 104.

The received response signals are processed by the corresponding central processing unit 305 of the test units 302, 303 to generate test result signals. In other words, the processor 305 of the sub-units 302, 303 evaluates and analyses the response signals of the sub-circuits 308, 309 to determine whether the sub-circuits 308, 309 have passed the test due to a proper quality, or not. For this purpose, a comparison may be carried out between the actually measured response signals and expected values. Such expected values may also be stored (for instance as test procedure data) in the storage units 306. The output of such a comparison is a test result signal created by the test units 302, 303.

The result signals generated by the central processing units 305 may be transmitted, via a fourth interface 311 from the test units 302, 303 to the workstation 201 to provide the workstation 201 with the test result signals.

Figure 4:
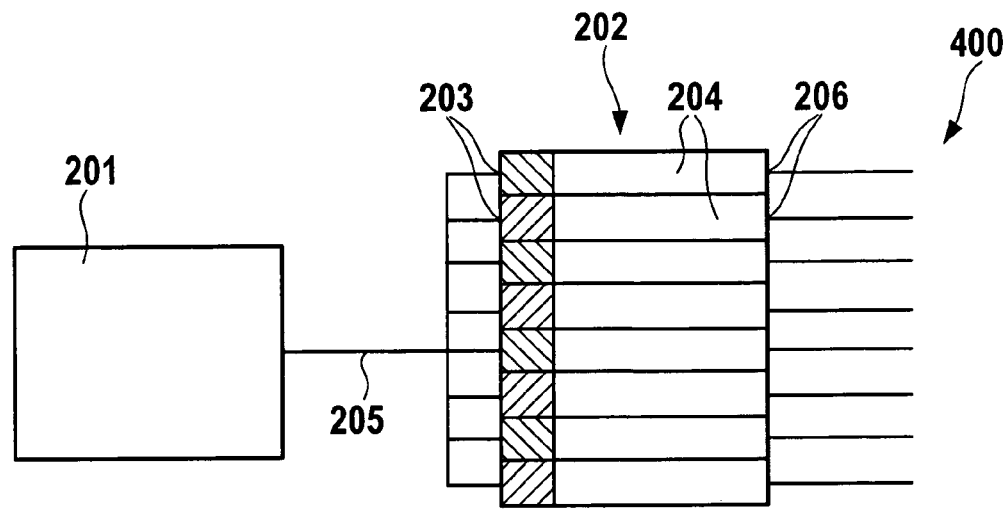
FIG. 4 shows a test array for testing a device under test according to still another exemplary embodiment of the invention.

In FIG. 4, a test array 400 according to another exemplary embodiment of the invention is depicted.

The test array 400 shown in FIG. 4 is similar to the test array 200 shown in FIG. 2. However, it is shown in more detail in FIG. 4, that the workstation 201 is connected to each of the test units 204 of the test device 202 via a separate interface 203.

Figure 5:
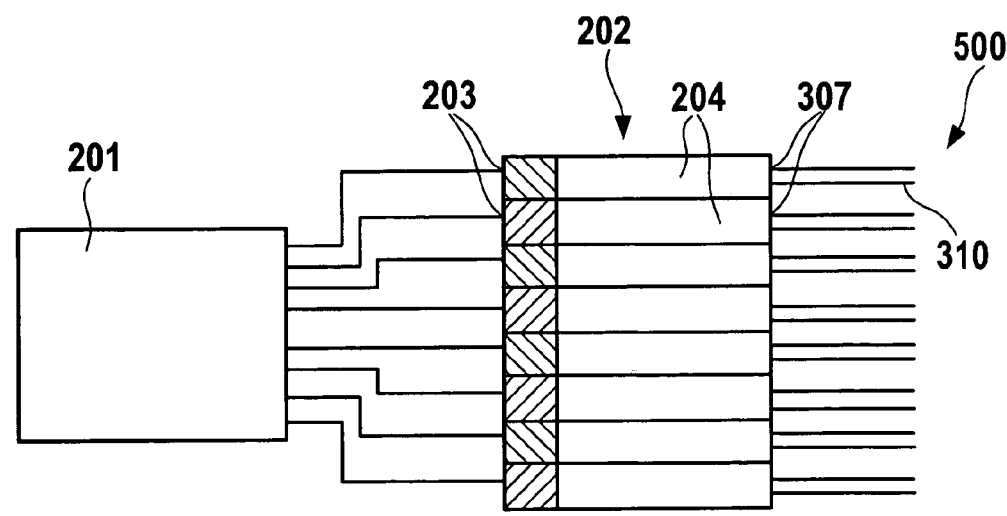
FIG. 5 shows a test array for testing a device under test according to yet another exemplary embodiment of the invention.

In the following, referring to FIG. 5, a test array 500 according to still another embodiment of the invention will be described.

A main difference between the test array 500 and the test array 400 is that the connections between the first interfaces 203 of the test units 204 of the test device 202 and the workstation 201 are now strictly isolated from one another. In other words, a completely parallel processing of the data received and processed by each of the test units 204 is possible, since the connections to the workstation 201 are provided separately for each test unit 204. Further, in the case of the test array 500, each of the test units 204 has two interfaces 307, 310 to a (portion of a) device under test (not shown in FIG. 5) for transmitting data to the device under test or for receiving response signals from the device under test. This avoids undesired interference or crosstalk between signals sent and received by the test device 202.

In the following, referring to FIG. 6, a test array 600 according to still another embodiment of the invention will be described.

Figure 6:
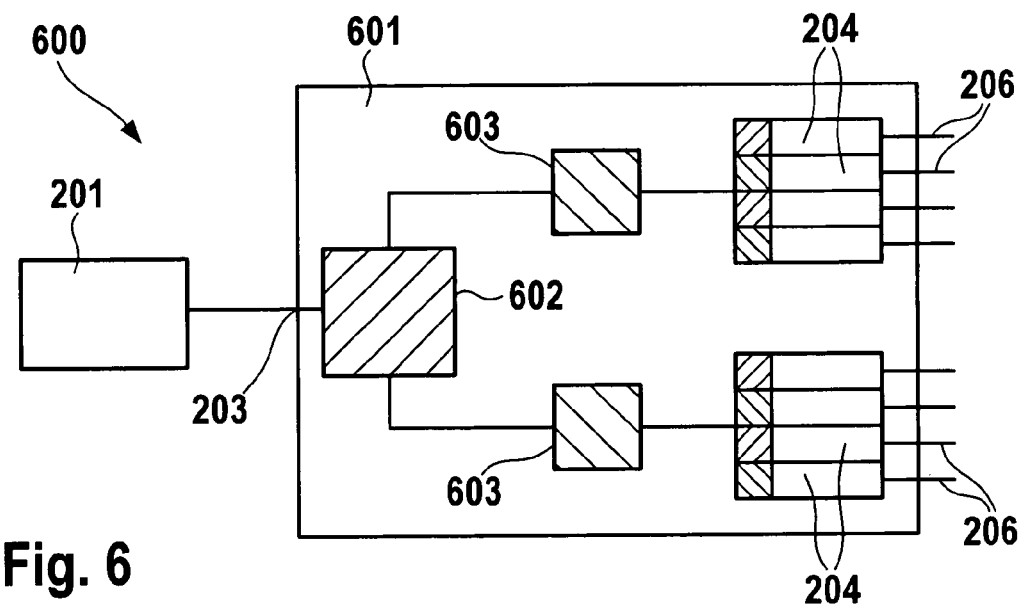
FIG. 6 shows a test array for testing a device under test according to another exemplary embodiment of the invention.

A hierarchically distributed test intelligence scheme is provided by the embodiment shown in FIG. 6. A test device 601 of the test array 600 comprises a hierarchical sequence of processing stages which are provided in a cascade-like manner. In addition to the test units 204 which have already been described particularly referring to FIG. 2 and FIG. 3, two additional stages of processing test signals are realized in the test device 601.

A first interface 203 of the test device 601 for coupling the latter with a workstation 201 is coupled with a processor 602 of to a first processing stage, which might also be denoted as a first stage of test resources. In the processor 602, pre-processing test steps may be carried out which are common for all portions of a device under test, regardless which one of the test units 204 will communicate directly with the corresponding portion of the device under test. For instance, generic test commands sent by the workstation 201 to the test device 601 may be translated into more specific test commands in the first test resource stage.

In a second test resource stage succeeding the first test resource stage, two processors 603 are connected in parallel to one another and are connected in series with the processor 602. The upper processor 603 according to FIG. 6 will carry out intermediate processing steps which are common for the test units 204 of the upper half of FIG. 6. Such processing steps, which are common for all test units 204 according to the lower half of FIG. 6 are carried out by the lower processor 603 according to FIG. 6.

The sub-units 204 in both branches of the tree-like architecture of FIG. 6 might be denoted as a third test resource stage and are most specifically adapted to the requirements of the directly connected portions of a DUT. By hierarchically connecting the stages in a cascade-like manner, common intelligence can be bundled. Thus, the efficiency of the processing is increased.

In the case of a hierarchical structure as shown in FIG. 6, the different stages may be synchronized to enable a proper signal transmission scheme. Such a synchronization may be particularly advantageous in case of a parallel access on local resources. For properly synchronizing the stages, the local intelligence of a level n may send an abstract request to local intelligence of a level n−1, etc., until local intelligence of a level k (k<n) can execute the request and returns a result to the local intelligence of level n.

Figure 7:
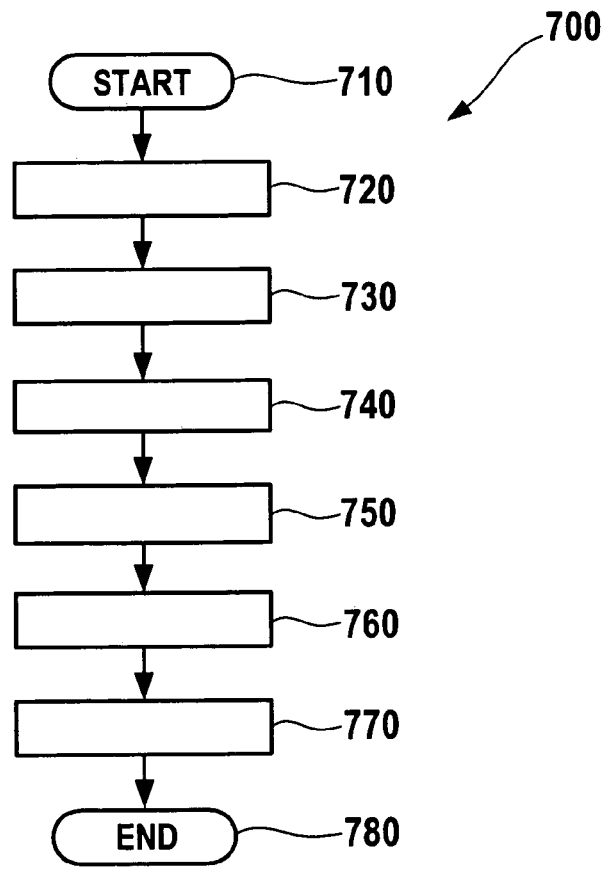
FIG. 7 shows a flow chart illustrating steps of a method of testing a device under test by a test device according to another exemplary embodiment of the invention.

In the following, referring to FIG. 7, a flow chart 700 will be described illustrating steps of a method of testing a device under test by a test device according to another exemplary embodiment of the invention.

In a step 710, the method starts.

In a step 720, a test procedure activation signal is supplied from a central control device to the test device.

In a step 730, a test procedure for testing the device under test is generated on the basis of test procedure data stored in the test device upon receipt of the test procedure activation signal.

In a step 740, the device under test is tested by executing the test procedure.

In a step 750, response signals in response to the test procedure are received by the test device from the device under test.

In a step 760, the response signals are processed by the test device to generate test result signals.

In a step 770, the test result signals are supplied to the central control device for output to a user.

In a step 780, the method ends.

It should be noted that the term "comprising" does not exclude other elements or steps and the "a" or "an" does not exclude a plurality. Also elements described in association with different embodiments may be combined. It should also be noted that reference signs in the claims shall not be construed as limiting the scope of the claims.

What is claimed is:

1. A test device for testing a device under test, wherein the test device is adapted for transmitting a test signal to the device under test and receiving a response signal from the device under test, comprising:
   a first interface for receiving a test procedure activation signal from a central controller;
   a processor, coupled to receive the test procedure activation signal via the first interface, for i) performing a test procedure upon receipt of the test procedure activation signal, ii) receiving a feedback signal from the device under test, iii) determining from the feedback signal properties of a physical connection between the test device and the device under test, and iv) adjusting the test procedure to modify the test signal and compensate for the properties of the physical connection between the test device and the device under test.

2. The test device of claim 1, comprising a storage unit for storing a test procedure data, wherein the processor is adapted for generating the test signal based on the test procedure data.

3. The test device of claim 1, wherein the processor is adapted for adjusting, in response to the feedback signal, at least one of the following test parameters: a wave form, a voltage, and a current of the test signal.

4. The test device of claim 3, wherein the processor is adapted to evaluate the feedback signal in order to determine a behavior of the signal path between the test device and the device under test, to compare this behavior with a desired behavior and to adjust the test parameters of the test signal based on the comparison result.

5. The test device of claim 3, wherein the processor is adapted to evaluate the feedback signal in order to determine test signal distortions resulting from at least one of the group consisting of signal damping, signal reflection, and signal delay, and to adjust the test parameters so that the distortions are at least partly compensated.

6. The test device of claim 1, adapted for testing a device under test which comprises a plurality of pins connected each to different pins of the test device by performing the test procedure individually for different connections.

7. The test device of claim 1, adapted for performing the test procedure in such a manner that parameters of signals of the test procedure are adjusted based on the feedback signal.

8. The test device of claim 1, comprising a second interface adapted to couple the test device to the device under test to perform the test procedure with the device under test.

9. The test device of claim 1, comprising a third-interface adapted to couple the test device to the device under test to provide the test device with response signals generated by the device under test in response to performing the test procedure.

10. The test device of claim 9, wherein the processor is adapted to process the response signals to generate test result signals.

11. The test device of claim 10, comprising a fourth interface adapted to couple the test device to the central controller to provide the central controller with the test result signals.

12. The test device of claim 1, wherein the test device comprises a plurality of test units, wherein each of the test units is adapted to independently test an assigned portion of the device under test.

13. The test device of claim 12, wherein the plurality of test units are connected for testing at least a part of the assigned portions of the device under test simultaneously.

14. The test device of claim 1, comprising a plurality of processors and/or a plurality of storage units cascaded in a hierarchical manner.

15. The test device of claim 1, adapted to test at least one electronic circuit, particularly at least one integrated circuit, as a device under test.

16. The test device of claim 1, wherein the test procedure is adapted to fulfill at least one of the functions of the group consisting of a calibration function, a compensation function, a time control function, a synchronization function, a comparison function, and a test signal pattern generation function.

* * * * *

UNITED STATES PATENT AND TRADEMARK OFFICE
CERTIFICATE OF CORRECTION

PATENT NO. : 7,550,988 B2 Page 1 of 1
APPLICATION NO. : 11/388306
DATED : June 23, 2009
INVENTOR(S) : Schroth et al.

It is certified that error appears in the above-identified patent and that said Letters Patent is hereby corrected as shown below:

Column 12, Line 3, "302, 302" should read --302, 303--.

Signed and Sealed this

Twenty-second Day of September, 2009

David J. Kappos
*Director of the United States Patent and Trademark Office*